United States Patent
Javerliac et al.

(10) Patent No.: US 8,228,702 B2
(45) Date of Patent: Jul. 24, 2012

(54) ULTIMATE MAGNETIC RANDOM ACCESS MEMORY-BASED TERNARY CAM

(75) Inventors: Virgile Javerliac, Grenoble (FR); Mourad El Baraji, Sunnyvale, CA (US)

(73) Assignee: Crocus Technology SA, Grenoble Cedex (FR)

( * ) Notice: Subject to any disclaimer, the term of this patent is extended or adjusted under 35 U.S.C. 154(b) by 206 days.

(21) Appl. No.: 12/821,284

(22) Filed: Jun. 23, 2010

(65) Prior Publication Data

US 2011/0002151 A1 Jan. 6, 2011

(30) Foreign Application Priority Data

Jul. 2, 2009 (EP) .................................... 09290534

(51) Int. Cl.
*G11C 15/00* (2006.01)
*G11C 15/02* (2006.01)
*G11C 11/00* (2006.01)
*G11C 11/14* (2006.01)
*G11C 11/15* (2006.01)

(52) U.S. Cl. ...... 365/49.1; 365/49.17; 365/50; 365/158; 365/171; 365/173

(58) Field of Classification Search ................ 365/49.1, 365/49.17, 50, 158, 171, 173
See application file for complete search history.

(56) References Cited

U.S. PATENT DOCUMENTS

| | | | | |
|---|---|---|---|---|
| 7,499,303 B2 * | 3/2009 | Lien et al. | ..................... | 365/49.1 |
| 7,714,399 B2 * | 5/2010 | Morise et al. | .................. | 365/158 |
| 7,948,782 B2 * | 5/2011 | Chang et al. | .................. | 365/49.1 |
| 8,023,299 B1 * | 9/2011 | Gharia | .......................... | 365/49.1 |
| 8,125,810 B2 * | 2/2012 | Bosshart | ....................... | 365/49.1 |

FOREIGN PATENT DOCUMENTS

WO 2008040561 A2 4/2008

OTHER PUBLICATIONS

El Baraji, Mourad; Javerliac, Virgile: "Towards an Ultra-Low Power,High Density and Non-Volatile Ternary CAM", Non-Volatile Memory Technology Symposium, 2008. NVMTS 2008. 9th Annual, IEEE, Piscataway, NJ, USA Nov. 11, 2008, pp. 1-7.
European Search Report for Application EP09290534, dated Dec. 10, 2009.

* cited by examiner

*Primary Examiner* — Trong Phan
(74) *Attorney, Agent, or Firm* — Pearne & Gordon LLP (57) ABSTRACT

The present disclosure concerns a magnetic random access memory-based ternary content addressable memory cell, comprising a first and second magnetic tunnel junction respectively connected to a first and second straps extending on each side of the first and second magnetic tunnel junctions, respectively; a first and second selection transistors, respectively connected to one extremity of the first and second straps; a first and second current lines; and a conductive line electrically connecting in series the first and second magnetic tunnel junctions at their ends opposed to the ones connecting the first and second straps. The cell disclosed herein has smaller size and can be advantageously used in memory devices having a high cell density array.

17 Claims, 5 Drawing Sheets

ULTIMATE MAGNETIC RANDOM ACCESS MEMORY-BASED TERNARY CAM

FIELD OF THE INVENTION

The present disclosure relates to magnetic random access memory and more particularly, but not exclusively, to magnetic random access memory MRAM-based ternary content addressable memory comprising magnetic tunnel junctions.

DESCRIPTION OF RELATED ART

Content Addressable Memory (CAM) is an outgrowth of Random Access memory (RAM) technology. Unlike RAMs which access a word based on its address, CAMs access a word based on its contents. A CAM stores data in a similar fashion to a conventional RAM. However, "reading" the CAM involves providing input data to be matched, then searching the CAM for a match so that the address of the match can be output. A CAM is designed such that the user supplies a data word and the CAM searches its entire memory in one-clock cycle to see if that data word is stored anywhere in it. If the data word is found, the CAM returns a list of one or more storage addresses where the word was found. The CAM can be preloaded at device start-up and rewritten during device operation.

To search the entire memory quickly, CAM employs separate match logic per each memory row. When a search key is presented by the user, each search key bit will become visible to all the match logic cells in a column at the same time. Each row of match logic cells will then perform a bit-by-bit comparison between the provided search key and the stored key in the associated memory row. Comparison results will be reduced to a binary value (e.g., 1 for match and 0 for mismatch) and are fed into a priority encoder, which finally produces the search result. Since comparisons for all the memory rows are performed in parallel, CAM achieves high-bandwidth, constant-time search performance.

CAMs, and specifically Ternary CAMs (TCAMs), are mostly used in networking devices. They provide read and write such as normal memory, but additionally support search which will find the index of any matching data in the entire memory. A TCAM in particular can include wildcard bits which will match both one and zero. Theses wildcards can be used on both the access operations of the memory (indicating some bits of the search have a "don't care" value) or can be stored with the data itself (indicating some bits of the data should not be used for determining a match). When the mask bit is active (e.g., set to a logic 0 value), the ternary CAM cell is treated as storing a "don't care", or X, value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Therefore a TCAM can perform a partial matching. The fully parallel search provided by TCAM eases the implementation of many complex operations such as routing table lookup. Because the TCAM searches every location in memory at once, the ordering of the element in the TCAM is less important and large indexing structures can often be entirely avoided. This parallel search directly implements the requirements of some applications (such IP-Lookup), and can serve as the building block of more searching schemes. TCAM is also used in other high-speed networking applications such as packet classification, access list control, pattern matching for intrusion detection. TCAM are also used with network processors as a co-processor to complement the network processors in several applications such as packet classification and routing lookup.

A typical implementation of a static random access memory (SRAM) TCAM cell consists of a ternary storage containing two SRAM cells which combines ten to twelve transistors. It also has comparison logic, which is basically a XNOR gate using four additional pass transistors. Thus implementation results in very large cells size of fourteen to sixteen transistors, and hence in a costly device.

Recently, a magnetic random access memory (MRAM)-based TCAM using a thermally-assisted switching (TAS) or a spin torque transfer (STT) procedure has been proposed in the co-pending European patent application No. 08291025, filed Nov. 4, 2008, which is assigned to the assignee of the present application and the disclosure of which is hereby incorporated herein by reference in its entirety and for all purposes.

Figure 1:
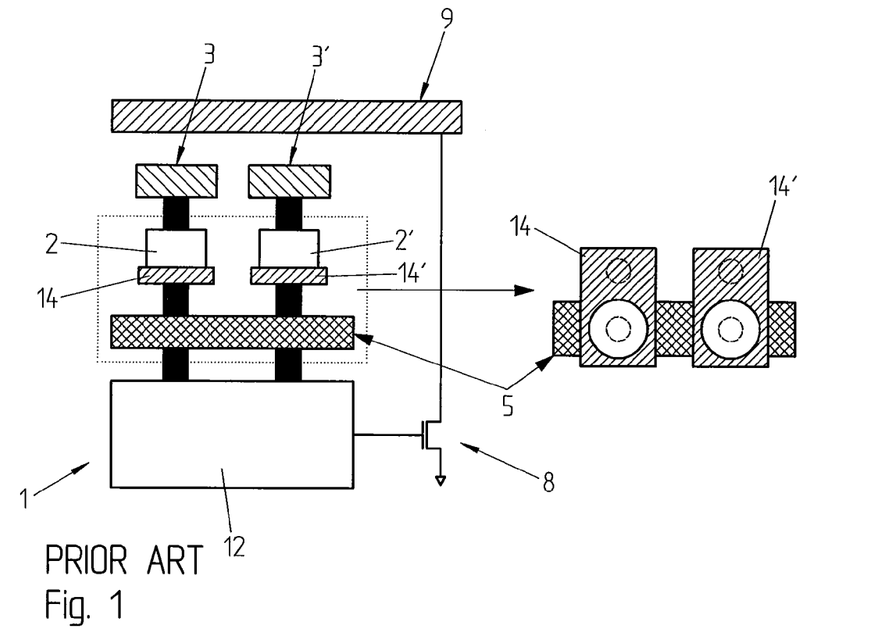
FIG. 1 shows a conventional thermally-assisted switching (TAS), magnetic random access memory (MRAM)-based content ternary addressable memory (TCAM) cell.

An example of such TAS-MRAM TCAM cell 1 is shown schematically in FIG. 1. The TAS-MRAM TCAM cell 1 comprises a first and a second magnetic tunnel junction 2, 2', each magnetic tunnel junction 2, 2' being formed from an insulating layer disposed between a storage layer and a sense layer (the insulating, storage and sense layers are not shown in FIG. 1). The two magnetic tunnel junctions 2, 2' are arranged such as to share a first field line 5 and a second field line (also not shown), but can still be addressed by two distinct current lines 3, 3'. The first and second magnetic tunnel junctions 2, 2' are electrically connected to a selection transistor (not shown) through a first and second strap 14, 14', respectively. A built-in CMOS preamplifier 12, electrically connected to the junctions 2, 2'. The CMOS preamplifier 12 typically comprises an enable transistor (not shown), and two P-channel MOSFET transistors and two N-channel MOSFET transistors (also not shown). In FIG. 1, the inset shows the two magnetic tunnel junctions 2, 2' viewed form top.

During a write operation, a write field current (not represented) is passed in the first field line 5 in order to generate a write magnetic field able to switch the magnetization direction of the storage layer and store data bit with a high logic state "1" or low logic state "0", depending on direction of the write field current, respectively. A heating current pulse (also not represented) is successively passed through the first and second magnetic tunnel junctions 2, 2' in order to facilitate the switching of the storage layer magnetization.

During a search operation, a search data bit with a high "1" or low "0" logic state is successively provided to the sense layer of the first and second magnetic tunnel junctions 2, 2' via the first field line 5, in order to search a stored data bit in the cell 1. To this end, a search field current is passed through the field line 5, generating a search magnetic field able to switch the magnetization direction of the sense layer of each magnetic tunnel junction 2, 2', according to the direction of the search magnetic field. The magnetization direction of the sense layer is then compared with the magnetization direction of the storage layer by measuring the differential junction resistance between the first and second magnetic tunnel junctions 2, 2'. The TAS-MRAM TCAM cell 1 further comprises a pull down NMOS sense transistor 8 driven by the CMOS preamplifier 12 and a pre-charged match line 9 controlled by the sense transistor 8. The CMOS preamplifier 12 acts as a 1-bit analog-to-digital converter (ADC), converting the differential resistance of the magnetic tunnel junctions 2, 2' into a binary rail-to-rail voltage, and driving the pull down NMOS transistor 8 from a blocked to a passing mode, in order to discharge or not the pre-charged match line 9.

The TAS-MRAM TCAM cell 1 has a rather large size due to the CMOS preamplifier 12 using at least five transistors. Moreover, the TAS-MRAM TCAM cell 1 has a high capacity resulting in a slow search operation, and high power consumption. There is therefore a need for a TAS-MRAM TCAM cell having a higher searching speed and lower power consumption.

Document WO2008/040561 discloses a CAM having magnetic tunnel junction-based memory cells. The magnetic tunnel junction has first and second magnetic layers and can act as a data store and a data sense. Within each cell, registered data is written by setting a magnetic orientation of the first magnetic layer in the magnetic tunnel junction via current pulses in one or more current lines. Input data for comparison with the registered data can be similarly set through the magnetic orientation of the second magnetic layer via the current lines. The data sense is performed by measuring cell resistance, which depends upon the relative magnetic orientation of the magnetic layers. Since data storage, data input, and data sense are integrated into one cell, the memory combines higher densities with non-volatility. The memory can support high speed, reduced power consumption, and data masking.

Document M. El Baraji et. al., "Towards an ultra-low power, high density and non-volatile Ternary CAM", Technology Symposium, 2008, 9$^{th}$ Annual IEEE, Piscataway, N.J., USA, 11 Nov. 2008, pages. 1-7, presents a design of a 18 Kb non-volatile TCAM integrating MRAM devices. Magnetic TCAM can simplify conventional TCAM cell from sixteen transistors to two MRAM cells and six transistors. Furthermore, such device is intrinsically non volatile, e.g. power-failure-resistant. The MRAM cells are used both to store the information and to compare it (search) to the inputted data like an XOR logic function, whilst the CMOS part is used to detect and amplify the cell state.

BRIEF SUMMARY OF THE INVENTION

The present application discloses a magnetic random access memory-based ternary content addressable memory cell which overcomes at least some limitations of the prior art.

One embodiment comprises a cell having a smaller size, a high searching speed and lower power consumption.

According to the embodiments, a magnetic random access memory-based ternary content addressable memory cell, comprising: a first and second magnetic tunnel junction; a first and second straps, respectively connected to the first and second magnetic tunnel junction and extending on each side of the first and second magnetic tunnel junctions, respectively; a first and second selection transistors, respectively connected to one extremity of the first and second straps and allowing passing a heating current selectively through the first and second straps, respectively; and a first and second current lines for passing the heating current and/or a sense current; wherein the cell further comprises a conductive line electrically connecting in series the first and second magnetic tunnel junctions at their ends opposed to the ones connecting the first and second straps; and in that the first and second current lines are respectively connected to the other extremity of the first and second straps; for passing the sense current through the first and second magnetic tunnel junctions when the two selection transistor are in a blocked mode.

In an embodiment, the cell further comprises a first field line for passing at least a first write field current In another embodiment, the cell further comprises a second field line disposed substantially perpendicular to the first field line.

In yet another embodiment, the cell further comprises a sense transistor electrically connected to a match line, the sense transistor being driven by a voltage on the conductive line, between the two magnetic tunnel junctions.

In yet another embodiment, the cell further comprises a bit transistor electrically connected to a bit line, and a search word line, the bit transistor being controlled by the search word line, for passing bit current in the bit line.

In yet another embodiment, each magnetic tunnel junction is formed from a storage layer having a magnetization that can be switched from a first stable direction to a second stable direction, a sense layer having a variable magnetization direction, and an insulating layer between the storage layer and the sense layer.

In yet another embodiment, the storage layer is made of a hard ferromagnetic material.

In yet another embodiment, the sense layer is made of a low coercivity, soft ferromagnetic material.

In yet another embodiment, each magnetic tunnel junctions further comprises an antiferromagnetic storage layer exchange biasing the storage layer, unpinning its magnetization at a high temperature threshold.

In yet another embodiment, a magnetic memory device is formed by assembling an array comprising a plurality of the magnetic random access memory-based ternary content addressable memory cells.

The present disclosure also pertains to a method of writing and searching a write data in the magnetic random access memory-based ternary content addressable memory cell, comprising:

during a write operation:

writing a first write data to the storage layer of the first magnetic tunnel junction, during a first write cycle of the write operation; and writing a second write data to the storage layer of the second magnetic tunnel junction, during a second write cycle of the write operation; and during a search operation:

aligning the magnetization of the sense layer of the first and second magnetic tunnel junctions in a first and second aligned directions, according to a search field current polarity passing in the first field line; and comparing said first and second write data to the aligned magnetization of the sense layer of the two magnetic tunnel junctions by passing the sense current through the first and second magnetic tunnel junctions via the first and second straps when the first and second selection transistors are in a blocked mode.

In an embodiment, said writing a first write data comprises:

heating the first magnetic tunnel junction to a high temperature threshold;

switching the magnetization of the storage layer of the first magnetic tunnel junction in a first direction, and cooling the first magnetic tunnel junction to a low temperature threshold at which the magnetization of the storage layer of the first magnetic tunnel junction is frozen in the written state; and said writing a second write data comprises:

heating the second magnetic tunnel junction to a high temperature threshold;

switching the magnetization of the storage layer of the second magnetic tunnel junction in a second direction, and cooling the second magnetic tunnel junction to a low temperature threshold at which the magnetization of the storage layer of the second magnetic tunnel junction is frozen in the written state.

In another embodiment, said cell further comprises a second field line disposed substantially perpendicular to the first field line; and said switching the magnetization of the storage layer of the first magnetic tunnel junction includes passing a first write field current having a first polarity through the first field line or the second field line; and said switching the magnetization of the storage layer of the second magnetic tunnel junction includes passing a second write field current having a second polarity through the first field line or the second field line.

In yet another embodiment, said heating the first magnetic tunnel junction includes passing the heating current through the first strap when the first selection transistor is in a passing mode; and wherein said heating the second magnetic tunnel junction includes passing the heating current through the second strap when the second selection transistor is in the passing mode.

In yet another embodiment, said search field current has a sequentially changing polarity.

In yet another embodiment, the cell further comprises a sense transistor electrically connected to a pre-charged match line, the sense transistor being driven by a voltage on the conductive line, between the two magnetic tunnel junctions; and said passing a sense current generates a voltage on the conductive line, between the two magnetic tunnel junctions, the voltage driving the sense transistor to discharge or not the match line, depending on the first and second write data and the respective direction of the aligned sense layer magnetization in the two magnetic tunnel junctions.

Due to its small size, the cell disclosed herein can be used to make magnetic memory devices having a higher density array of cells with increased speed of the search operation. The cell also allows for lower manufacturing costs.

BRIEF DESCRIPTION OF THE DRAWINGS

The preferred embodiments will be better understood with the aid of the description of an embodiment given by way of example and illustrated by the figures, in which.

DETAILED DESCRIPTION OF POSSIBLE EMBODIMENTS OF THE INVENTION

Figure 2A:
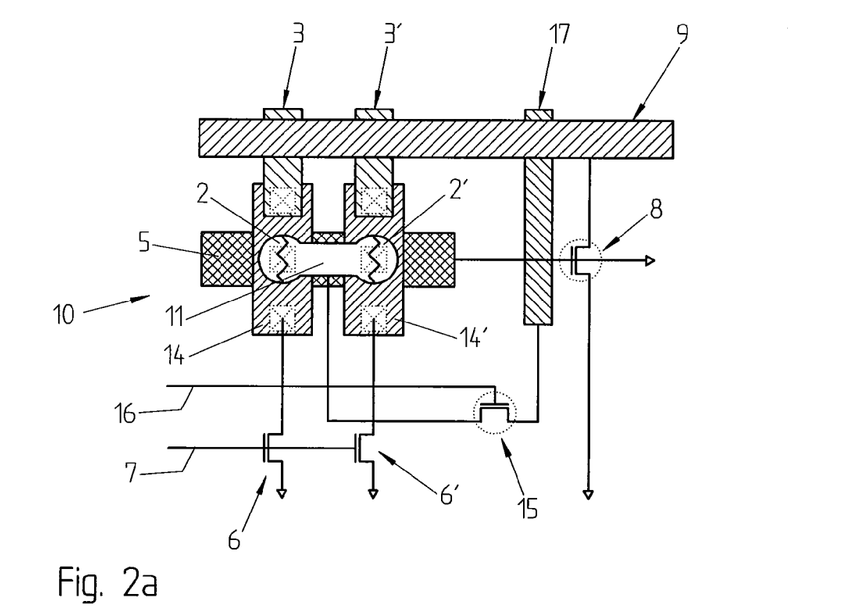
FIG. 2a shows layout-mask representation viewed from top of a magnetic random access memory (MRAM)-based ternary content addressable memory (TCAM) cell according to an embodiment.
Figure 2B:
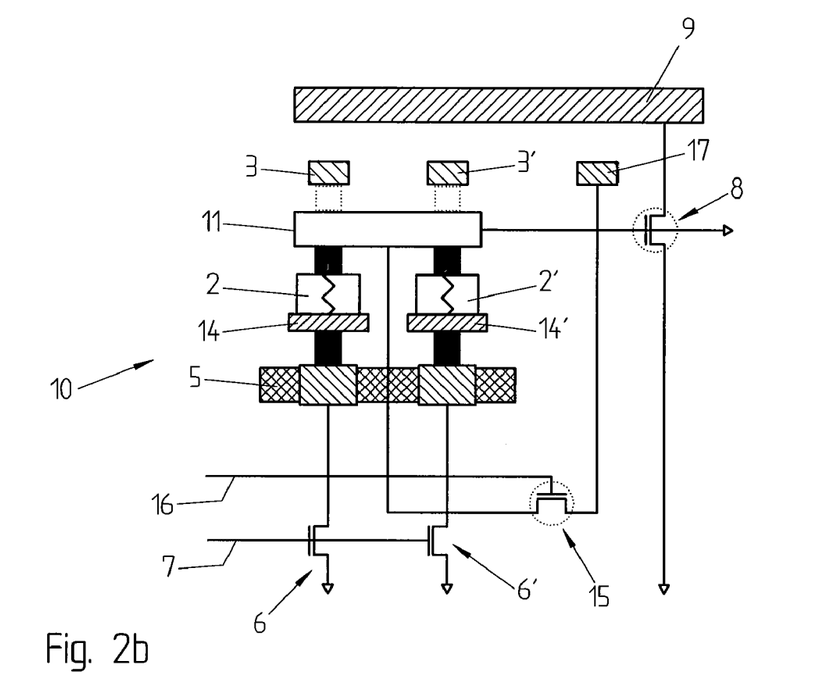
FIG. 2b shows a layout-mask representation viewed from the side of the TAS-MRAM TCAM cell.
Figure 3:
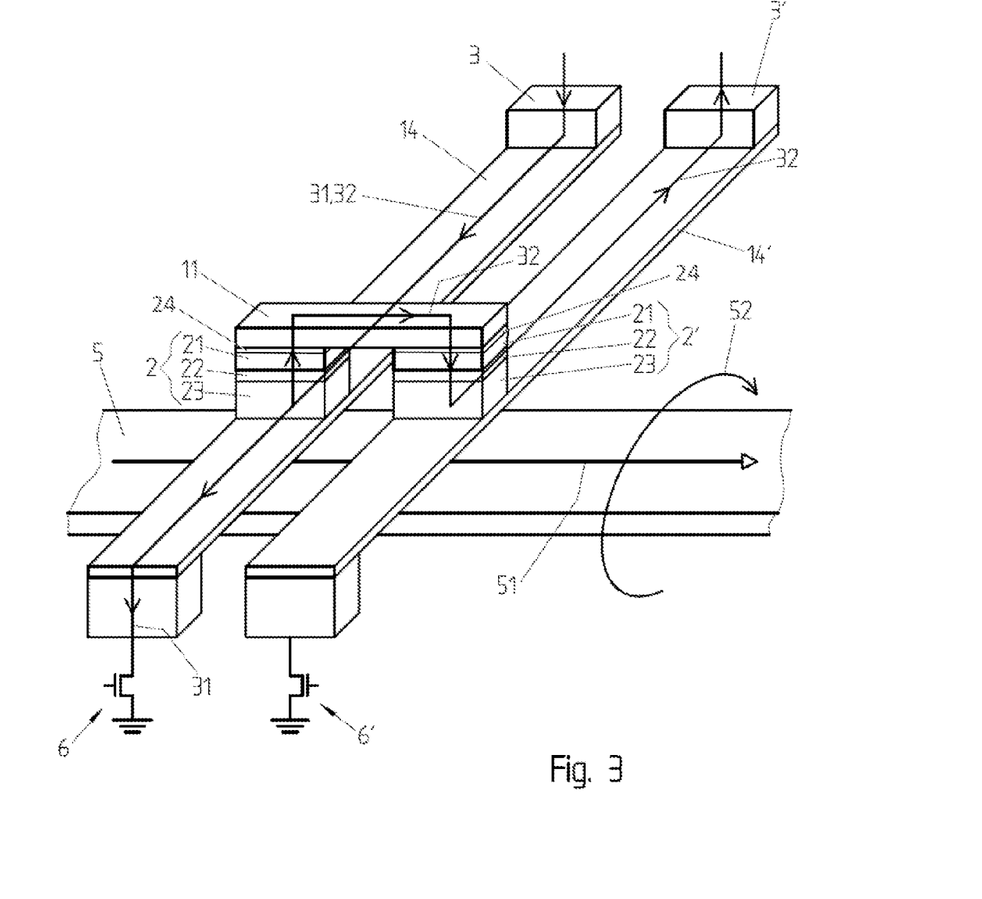
FIG. 3 represents a perspective view the TAS-MRAM TCAM cell.

A magnetic random access memory (MRAM)-based ternary content addressable memory (TCAM) cell 10 is shown in FIGS. 2a, 2b and 3, according to an embodiment. More particularly, FIGS. 2a and 2b shows a layout-mask representation of the MRAM-based TCAM cell 10 viewed from top (FIG. 2a) and viewed from the side (FIG. 2b). FIG. 3 shows a perspective view of the MRAM-based TCAM cell 10.

The MRAM-based TCAM cell 10 comprises a first and second magnetic tunnel junction 2, 2'. The first and second magnetic tunnel junctions 2, 2' are electrically connected to a first strap 14 and a second strap 14', respectively, the first and second straps 14, 14' extending on each side of the first and second magnetic tunnel junctions 2, 2', respectively. A first and second selection transistor 6, 6', is connected to one extremity of the first and second strap 14, 14', respectively. The other extremities of the first and second straps 14, 14' are respectively connected to a first and second current line 3, 3'. The first and second selection transistor 6, 6' are selectable by a word line 7, allowing passing a heating current 31 selectively through the first strap 14 when the first selection transistor 6 is in a passing mode, and through the second strap 14' when the second selection transistor 6 is in the passing mode. The cell 10 further comprises a first field line 5 (see FIG. 3) in communication with the two magnetic tunnel junctions 2, 2', the first field line 5 being able to pass at least a first write field current 51.

In a preferred embodiment, an electrically conductive line, for example a metal 11, electrically connect in series the first and second magnetic tunnel junctions 2, 2' at their ends, opposed to the ones connecting the first and second straps 14, 14'. The metal 11 allows for passing a sense current 32 across the first and second magnetic tunnel junctions 2, 2' when the two selection transistor 6, 6' are in a blocked mode.

In the example of FIG. 3, each magnetic tunnel junction 2, 2' is formed from a storage layer 21 having a magnetization that can be switched from a first stable direction to a second stable direction, a sense layer 23 having a variable magnetization direction, and an insulating layer 22 disposed between the storage and sense layers 21, 23. Preferably, the storage layer 21 is made of a hard ferromagnetic material, while the sense layer 23 is made of a low coercivity, soft ferromagnetic material. The ferromagnetic materials include typically iron, cobalt nickel or their alloys. Preferably, the insulating layer 22 is a thin layer, typically in the nanometer range and is formed, for example, from any suitable insulating material, such as alumina or magnesium oxide.

In an embodiment not represented, each magnetic tunnel junction 2, 2' further comprises an antiferromagnetic storage layer 24, preferably adjacent to the storage layer 21 and exchange biasing the storage layer 21. The antiferromagnetic storage layer pins the magnetization of the storage layer 21 at a low temperature threshold, below a blocking temperature $T_{Bs}$ of the antiferromagnetic layer, and unpins the storage layer magnetization at a high temperature threshold, above the blocking temperature $T_{Bs}$. The antiferromagnetic layer 24 is typically made of an antiferromagnetic material such as IrMn, PtMn or NiMn.

Figure 4:
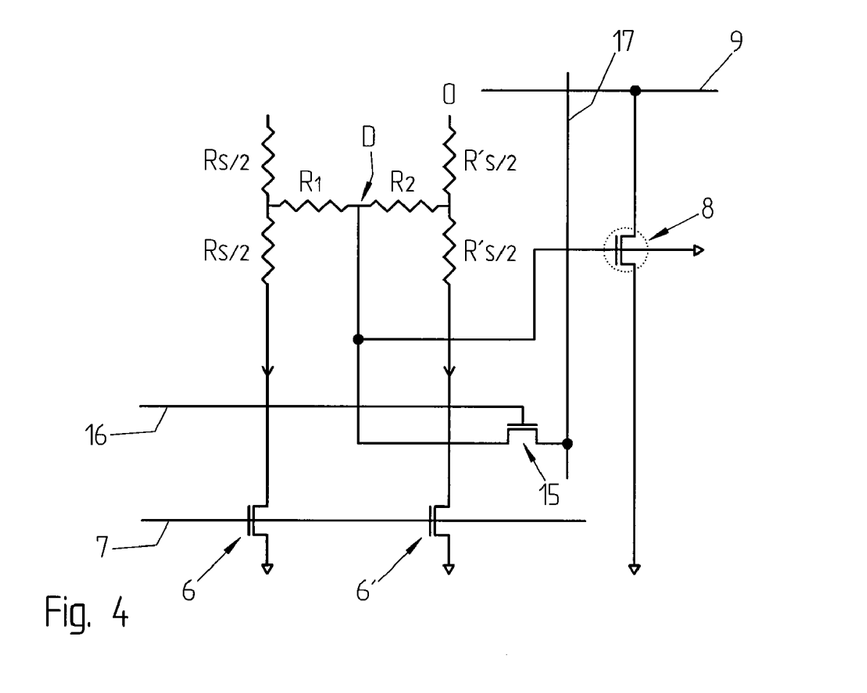
FIG. 4 shows an equivalent circuit of the MRAM-based TCAM cell.

An equivalent circuit 18 for the MRAM-based TCAM cell 10 of FIGS. 2a, 2b is shown in FIG. 4. In FIG. 4, the first and second straps 14, 14' are represented by the first and second strap resistances $R_s$, $R_s'$, respectively, and the first and second magnetic tunnel junctions 2, 2' are represented by the first and second junction resistance $R_1$ and $R_2$, respectively. In FIG. 4, the first and second straps resistances $R_s$, $R_s'$ are depicted as two $R_s'/2$ resistances and two $R_s/2$ resistances, respectively. The two magnetic tunnel junctions 2, 2' have a resistance that is much higher than the resistance of the first and second straps 14, 14'. For example, for a typical resistance-area product (RA) of 5 $k\Omega \cdot \mu m^2$ for each magnetic tunnel junction 2, 2', the corresponding junction resistances $R_1$, $R_2$ are about 500 $k\Omega$, while values for the strap resistances $R_s$, $R_s'$ are typically about 10 $k\Omega$.

During a write operation of the TAS-MRAM cell 10, in a first write cycle of the write operation, the first magnetic tunnel junction 2 is heated by applying a heating current 31 through the first current line 3 and the first strap 14, when the first selection transistor 6 is in a passing mode. The first magnetic tunnel junction 2 can be heated to a high temperature threshold lying above the blocking temperature $T_{Bs}$ where the exchange coupling between the antiferromagnetic layer and the storage layer 21 disappears and the magnetization of the storage layer 21 can be freely adjusted. The first junction resistance $R_1$ of the magnetic tunnel junction 2 being much higher than the first strap resistance $R_s$, essentially all the heating current 31 passes through the strap 14.

Simultaneously or after a short time delay, once the first magnetic tunnel junction 2 has reached the high temperature threshold, a first write data is written to the storage layer 21 of the first magnetic tunnel junction 2 by passing the moderate first write field current 51 having a first polarity through the first field line 5. The first write field current 51 induces a first write magnetic field 52 able to switch the magnetization of the storage layer 21 in a first direction, substantially perpendicular to the first field line 5. At the high threshold temperature the magnetization of the storage layer 23 can be freely adjusted, facilitating the switching operation.

After the temperature of the first magnetic tunnel junction 2 has reached the high temperature threshold, the first selection transistor 6 can be deselected (or set in a blocked mode) to inhibit the heating current 31 from being applied, to cool the first magnetic tunnel junction 2. The first write field current 51 can be maintained during the cooling of the first magnetic tunnel junction 2 and switched off once the first magnetic tunnel junction 2 has reached a low temperature threshold, lying below the blocking temperature $T_{BS}$ of the antiferromagnetic layer, where the magnetization of the storage layer 21 is frozen in the written state.

The write operation can further comprise a second write cycle, where the second magnetic tunnel junction 2' is heated by applying the heating current 31 through the second current line 3' and the second strap 14', when the second selection transistor 6' is in a passing mode. Simultaneously or after a short time delay, once the second magnetic tunnel junction 2' has reached the high temperature threshold, a second write data is written to the storage layer 21 of the second magnetic tunnel junction 2 by passing a second write field current 51' having a second polarity, opposed to the first polarity. The second write field current 51' induces a second write magnetic field 52' able to switch the magnetization of the storage layer 21 in a second direction substantially perpendicular to the first field line 5.

The first and second magnetic tunnel junctions 2, 2' are heated by the joule effect contribution due to the heating current 31 passing through the first and second strap 14, 14', respectively. Passing the heating current through the straps 14, 14' increases the reliability of the magnetic tunnel junctions 2, 2' since effects such as electromigration, voltage breakdown, or oxide degradation are minimized in the absence of a heating current flowing through the magnetic tunnel junction 2' themselves. Moreover, the magnetic tunnel junctions 2, 2' can have a high RA without impacting on the heating and reliability performances of the MRAM cell 10 allowing for a high tunnelling magnetoresistance (TMR), for example up to 250%.

In an embodiment not represented, the MRAM-based TCAM cell 10 further comprises a second field line disposed substantially perpendicular to the first field line 5. During the first and second write cycles of the write operation, the first write field current 51 and the second write field current 51' can be passed through the second field line, such that the induced first and second write magnetic fields 52, 52' switch magnetization of the storage layer 21 in a direction substantially parallel to the first field line 5.

Figure 5A:
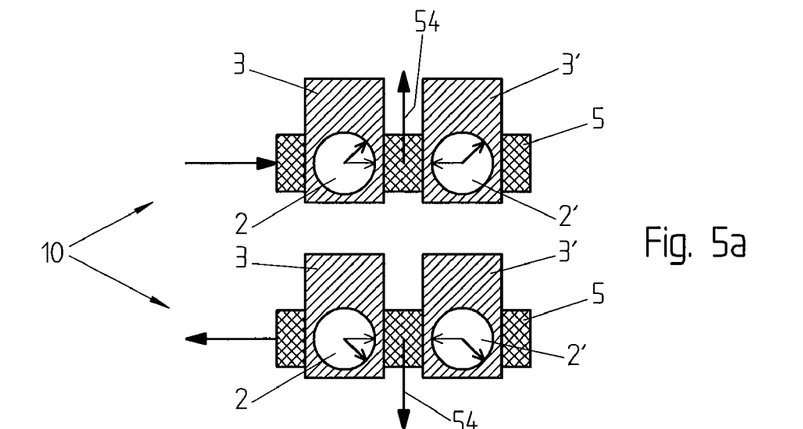
FIGS. 5a to 5c schematically show the respective orientation of the storage layer and sense layer magnetization.
Figure 5B:
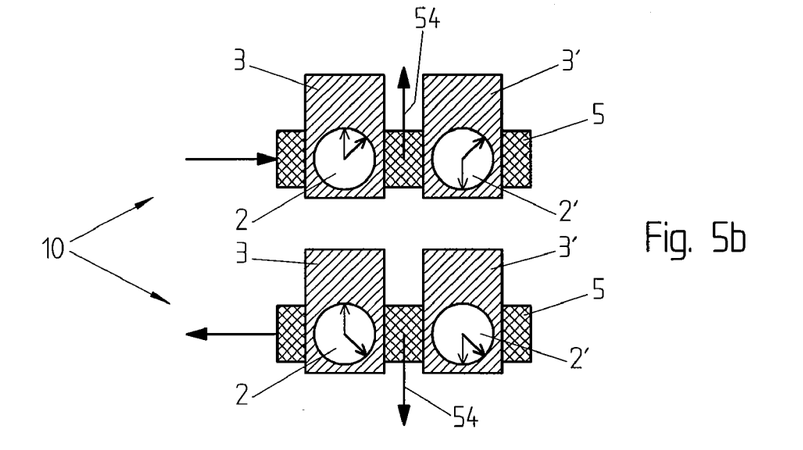
Figure 5C:
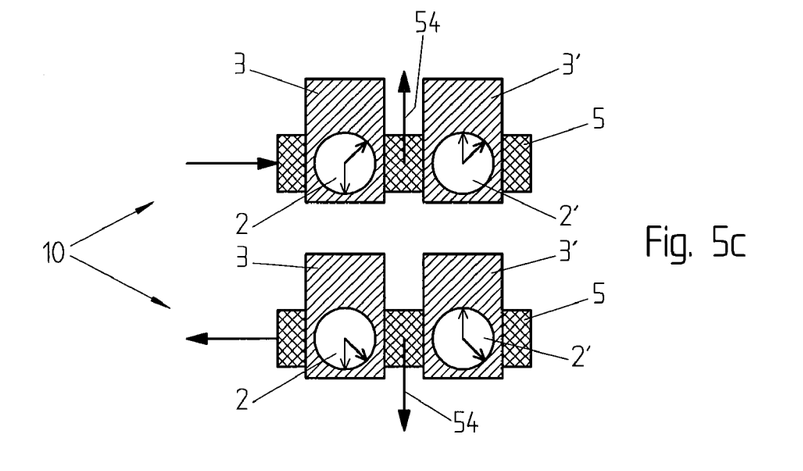

FIGS. 5a to 5 schematically show the first and second magnetic tunnel junctions 2, 2' viewed from top. In FIGS. 5a to 5c, the thin arrows represent the first and second write data written in the first and second magnetic tunnel junctions 2, 2', respectively. In the example of FIG. 5b, the first magnetic tunnel junction 2 comprises a write data with a logic state of "0" and the second magnetic tunnel junction 2' comprises a write data with a logic state of "1". This corresponds to the magnetization of the storage layer 21 being oriented perpendicular to the first field line 5, respectively upward and downward in the first and second magnetic tunnel junctions 2, 2'. In FIG. 5c, the first and second magnetic tunnel junctions 2, 2' comprises a write data with a logic state of "1" and "0", respectively, the storage layer magnetization being oriented perpendicular to the first field line 5, respectively downward and upward in the first and second magnetic tunnel junctions 2, 2'. In FIG. 5a, the storage layer magnetization of the first and second magnetic tunnel junctions 2, 2' are oriented substantially parallel to the first field line 5 and in the opposed direction, corresponding to write data having a masked logic state "X" in both magnetic tunnel junctions 2, 2'.

During a search operation of the TAS-MRAM cell 10, a search field current 53 having a sequentially changing polarity is passed in the first field line 5. Preferably, the search field current 53 has an alternating current inducing a search magnetic field 54 with a polarity varying accordingly. Since the magnetization of the sense layer 21 is not pinned and can be freely varied, the search magnetic field 54 is able to align the sense layer magnetization of both first and second magnetic tunnel junctions 2 2' simultaneously in a first and second aligned directions. Preferably, the amplitude of the search field current 53 is small and the search magnetic field 54 does not switch completely the magnetization of the sense layer 23. The amplitude of the search field current 53 can be, for example, about 700 µA, or less. This is much smaller than a current amplitude of about 15 mA or larger required to switch completely the magnetization of the sense layer 23, resulting in reduced power consumption. Power consumption can be further reduced by minimizing the switching energy of the sense layer 23 during the write operation. Moreover, the use of small search field current amplitude allows for high-speed search operation. During the search operation, the first and second selection transistors 6, 6' are in the blocked mode.

The direction of the sense layer magnetization aligned by the search magnetic field 54 is shown in FIGS. 5a to 5c by the bold arrows, for the first and second magnetic tunnel junctions 2, 2'. More particularly, the magnetic tunnel junctions 2, 2' shown on top of FIGS. 5a to 5c are represented with a sense layer magnetization aligned in an upward direction, for example corresponding to the first aligned direction, by the search field current 53 having a polarity corresponding to a logic state of "1". Conversely, the magnetic tunnel junctions 2, 2' shown beneath in FIGS. 5a to 5c are represented with a sense layer magnetization aligned in a downward direction, for example corresponding to the second aligned direction, by search field current 53 having a polarity corresponding to a logic state of "0".

The first and second write data written in the in the first and second magnetic tunnel junction 2, 2', respectively, can then be compared to the aligned magnetization of the sense layer 23 in the two magnetic tunnel junctions 2, 2' by passing a sense current 32 through the first and second magnetic tunnel junctions 2, 2', via the first and second current lines 3, 3', respectively. As shown in FIG. 3, the sense current 32 can circulate between the first and second current lines 3, 3' passing across the two magnetic tunnel junctions 2, 2' and the metal line 11, via the first and second straps 14, 14', respectively. The two magnetic tunnel junctions 2, 2' connected in series through the metal line 11 form a voltage divider between the first and second current lines 3, 3'.

In the example of FIG. 5b, the first and second magnetic tunnel junctions 2, 2' are written with the first and second write data having a logic state of "0" and a logic state of "1", respectively. The search field current 53 with a polarity corresponding to a logic state of "1" (top two magnetic tunnel junctions 2, 2') aligns the sense layer magnetization in a direction respectively closer to the storage layer magnetization in the first magnetic tunnel junction 2, and farther to the storage layer magnetization in the second magnetic tunnel junction 2'. The measured value for the first junction resistance $R_1$ is then smaller than the value measured for the second junction resistance $R_2$, yielding a negative tunnel magnetoresistance $\Delta R$. In contrast, the search field current 53 with a polarity corresponding to a logic state of "0" (lower two magnetic tunnel junctions 2, 2') aligns the sense layer magnetization in a direction respectively farther and closer to the storage layer magnetization in the first and second magnetic tunnel junction 2'. Here, the measured value for the first junction resistance $R_1$ is larger than the one for the second junction resistance $R_2$, yielding a positive tunnel magnetoresistance $\Delta R$.

In the example of FIG. 5c, the first and second magnetic tunnel junctions 2, 2' are written with the first and second write data having a logic state of "1" and a logic state of "0", respectively. Examination of the sense layer magnetization as described above shows that aligning the sense layer magnetization with the search field current 53 having a polarity corresponding to a logic state of "1" (top two magnetic tunnel junctions 2, 2'), yields a positive tunnel magnetoresistance $\Delta R$. Conversely, aligning the sense layer magnetization with the search field current 53 having a polarity corresponding to a logic state of "0" (lower two magnetic tunnel junctions 2, 2'), yields a negative tunnel magnetoresistance $\Delta R$.

In the example of FIG. 5a, the first and second magnetic tunnel junctions 2, 2' are written with the first and second write data having a logic state of "X". Here, aligning the sense layer magnetization with the search field current 53 having a polarity corresponding to a logic state of "1" and "0" (top and lower two magnetic tunnel junctions 2, 2', respectively), yields a negative tunnel magnetoresistance $\Delta R$, corresponding to a masked, or don't care, condition.

In an embodiment shown in FIG. 4, the circuit 18 comprises a sense transistor 8, preferably a pull-down NMOS transistor type, and a pre-charged match line 9. A voltage $V_D$ on the metal line 11 between the two magnetic tunnel junctions 2, 2' (point D on FIG. 4) is used to drive the gate of the sense transistor 8, the sense transistor 8 controlling the match line 9.

The voltage $V_D$, generated by the sense current 32, depends on the respective values of the first and second junction resistances $R_1$, $R_2$, the latter depending on the respective first and second write data and the polarity of the search field current 53 as described above. In the example of FIG. 5c, passing the search field current 53 with the logic state of "1" (top two magnetic tunnel junctions 2, 2') yields a high value of the voltage $V_D$. The high voltage $V_D$ sets the sense transistor 8 in a passing mode discharging match line 9, corresponding to a mismatched condition. Conversely, passing the search field current 53 with the logic state of "0" (lower two magnetic tunnel junctions 2, 2') yields a small value of the voltage $V_D$, setting the sense transistor 8 in a blocked mode where the match line 9 remains charged, corresponding to a matched condition.

Similarly, in the example of FIG. 5b, passing the search field current 53 with the logic state of "1" (top two magnetic tunnel junctions 2, 2') yields a small voltage value, corresponding to the match condition with the match line remaining charged, and passing the search field current 53 with the logic state of "0" (lower two magnetic tunnel junctions 2, 2') yields a high voltage value, corresponding to the mismatch condition with the match line being discharged. In the example of FIG. 5a, both passing the search field current 53 with the logic state of "1" and "0" yield a small value of the voltage $V_D$, the match line 9 remaining charged in both cases, corresponding to the masked, or don't care, condition.

In an embodiment not represented, the MRAM-based TCAM cell 10 comprises two match lines 9. The two match lines 9 can be used to provide a differential signal sensed at the end of the two match lines 9 in order to improve the read margin during the search operation. Preferably, in this configuration the sense transistor 8 is a pull-up PMOS transistor type.

In another embodiment shown in FIGS. 2a, 2b and 4, the MRAM-based TCAM cell 10 further comprises a bit transistor 15, the bit transistor 15 being controlled by a read word line 16 and electrically connected to a bit line 17. The read word line 16 can be enabled in order to set the bit transistor 15 in a passing mode, allowing a bit current (not represented) to flow in the bit line 17. In this configuration, the voltage $V_D$ of one single cell 10 can be read on the bit line 17.

The voltage difference $\Delta V_D$ between the voltages $V_D$ measured when the search field current 53 has the logic state of "1" and "0", respectively, can be determined by Equation 1:

$$\Delta V_D = V_D * (TMR/(2+TMR)) = 0.56 * TMR \qquad \text{(Equation 1)}.$$

In the case the magnetic tunnel junctions 2, 2' have a TMR of 250% and assuming the voltage difference $\Delta V_D$ has a value of 390 mV, high enough to get a significant difference between a match and mismatch conditions, Equation 1 yields a value of 0.7V for the voltage $V_D$. Consequently, the voltage $V_D$ must be large when the magnetic tunnel junctions 2, 2' have a high TMR value.

The speed of the search operation depends among others on the discharge time constant RC of the current and bit lines 3, 3', 17. Moreover, different RC values can be obtained depending if the sense transistor 8 is a pull-down or pull-up transistor and on the degree of leakage of the sense transistor 8. The degree of leakage can be minimized by appropriately tuning the body bias voltage of the sense transistor 8.

Figure 6:
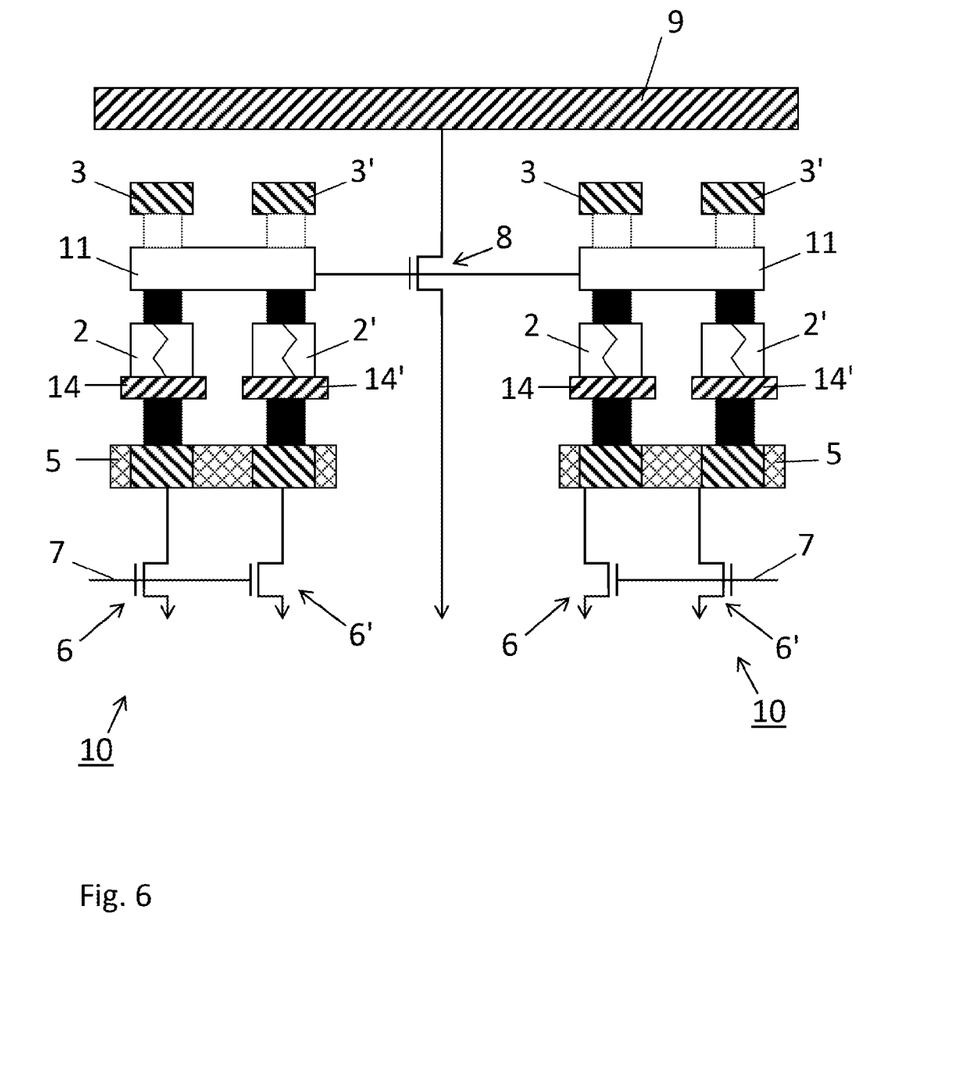
FIG. 6 shows an array comprising a plurality of MRAM-based TCAM cells, according to an embodiment.

In an embodiment represented in FIG. 6, a magnetic memory device can be formed by assembling an array comprising a plurality of the MRAM-based TCAM cell 10. The array of cells 10 can be disposed within a device package (not shown). When forming the magnetic memory device, each MRAM-based TCAM cell 10 can be connected to the match line 9 via the sense transistor 8, the match line 9 being possibly discharged by a single cell 10 of a row or column of the array during a search operation. The match line 9 can be coupled to a match line amplifier (not represented) able to amplify the signals to a full logic level and provide output signals in a conventional manner. The match line amplifier can be a differential sense amplifier and/or a multistage differential sense amplifier. The first field line 5 can address simultaneously one or several cells 10 in a row or column of the array, or address simultaneously all the cells 10 in the array. The latter configuration allows for decreasing the power per bit.

The disclosure is susceptible to various modifications and alternative forms, and specific examples thereof have been shown by way of example in the drawings and are herein described in detail. It should be understood, however, that the disclosure is not to be limited to the particular forms or methods disclosed, but to the contrary, the disclosure is to cover all modifications, equivalents, and alternatives.

The MRAM-based TCAM cell 10 comprising the two selection transistors 6, 6', the sense transistor 8 and possibly the bit transistor 15 has a reduced size, by a factor of about four, compared to a conventional MRAM cell using an additional CMOS pre-amplifier. The size of the MRAM-based TCAM cell 10 is also smaller than the one of conventional SRAM-Based TCAM cells using up to sixteen transistors or conventional MRAM-Based TCAM cells, using at least seven transistors. The MRAM-based TCAM cell 10 allows for magnetic memory devices with a higher cell density and low cost manufacturing since less masks and silicon are required.

The small size of the MRAM-based TCAM cell 10 also allows for reducing parasitic capacitances, especially along the match line 9 and the current lines 3, 3', and an increased speed of the search operation. For example, one search cycle can have a speed within the range comprised between 100 MHz to 200 MHz. Since a low voltage can be used in the current lines 3, 3, for example, about 0.5V for a 130 nm CMOS technology, the dynamic power consumption of the MRAM-based TCAM cell 10 can then be reduced by a factor of at least four. Static power consumption in the MRAM-based TCAM cell 10 is also lower than in a conventional MRAM-based TCAM cell. For example, one search cycle in the MRAM-based TCAM cell 10 can require a power of just about 50 nW.

The magnetic memory device can be further segmented in sub-arrays (not shown), containing a reduced number of the MRAM-based TCAM cells 10 than in the array, in order to reduce the time constant RC and increase the search operation speed. This configuration, however, requires using an additional driver for each current line 3, 3', and the first field line 5, in order to drive the sense, heating and field currents, respectively, in the respective sub-arrays, resulting in an increased die size and circuit complexity.

Reference Numbers And Symbols

1 MRAM-based TCAM cell
2 first magnetic tunnel junction
2' second magnetic tunnel junction
21 storage layer
22 insulating layer
23 sense layer
3 first current line
3' second current line
31 heating current
32 sense current
5 first field line
51 first write field current
52 first write magnetic field
51' second write field current
52' second write magnetic current
53 search field current
54 search magnetic field
6 first selection transistors
6' second selection transistor
7 first write word line
7' second write word line
8 sense transistor
9 match line
10 ultimate TAS-MRAM TCAM cell
11 metal line
12 CMOS preamplifier
14 first strap
14' second strap
15 bit transistor
16 read word line
17 bit line
18 circuit
$R_1$ first junction resistance
$R_2$ second junction resistance
$\Delta R$ tunnel magnetoresistance
$R_s$ first strap resistance
$R'_s$ second strap resistance
RC time constant
$V_D$ voltage measured at the voltage divider
$\Delta V_D$ differential voltage

The invention claimed is:

1. A magnetic random access memory-based ternary content addressable memory cell, comprising:
a first and second magnetic tunnel junction; a first and second strap, respectively connected to the first and second magnetic tunnel junction and extending on each side of the first and second magnetic tunnel junction, respectively;
a first and second selection transistor, respectively connected to one extremity of the first and second strap and allowing passing a heating current selectively through the first and second strap, respectively; and
a first and second current line for passing the heating current and/or a sense current; wherein
the cell further comprises a conductive line electrically connecting in series the first and second magnetic tunnel junctions at their ends opposed to the ones connecting the first and second straps, and the first and second current line are respectively connected to the other extremity of the first and second strap; for passing the sense current through the first and second magnetic tunnel junctions when the two selection transistor are in a blocked mode.

2. The cell according to claim 1, further comprising a first field line for passing at least a first write field current.

3. The cell according to claim 2, further comprising a second field line disposed substantially perpendicular to the first field line.

4. The cell according to claim 1, further comprising a sense transistor electrically connected to a match line, the sense transistor being driven by a voltage on the conductive line, between the two magnetic tunnel junctions.

5. The cell according to claim 1, wherein further comprising a bit transistor electrically connected to a bit line, and a read word line, the bit transistor being controlled by the read word line, for passing bit current in the bit line.

6. The cell according to claim 1, wherein each magnetic tunnel junction is formed from a storage layer having a magnetization that can be switched from a first stable direction to a second stable direction, a sense layer having a variable magnetization direction, and an insulating layer between the storage layer and the sense layer.

7. The cell according to claim 6, wherein the storage layer is made of a hard ferromagnetic material.

8. The cell according to claim 6, wherein the sense layer is made of a low coercivity, soft ferromagnetic material.

9. The cell according to claim 6, wherein each magnetic tunnel junctions further comprises an antiferromagnetic storage layer exchange biasing the storage layer, unpinning its magnetization at a high temperature threshold.

10. A magnetic memory device formed by assembling an array comprising a plurality of magnetic random access memory-based ternary content addressable memory cells, each cell comprising a first and second magnetic tunnel junction; a first and second strap, respectively connected to the first and second magnetic tunnel junction and extending on each side of the first and second magnetic tunnel junction, respectively; a first and second selection transistor, respectively connected to one extremity of the first and second strap and allowing passing a heating current selectively through the first and second strap, respectively; and a first and second current line for passing the heating current and/or a sense current; the cell further comprising a conductive line electrically connecting in series the first and second magnetic tunnel junction at their ends opposed to the ones connecting the first and second straps; the first and second current line being respectively connected to the other extremity of the first and second strap; for passing the sense current through the first and second magnetic tunnel junctions when the two selection transistor are in a blocked mode.

11. The magnetic memory device according to claim 10, wherein
each cell further comprises a sense transistor and is connected to a match line via the sense transistor.

12. A method of writing and searching a write data in a magnetic random access memory-based ternary content addressable memory cell comprising a first and second magnetic tunnel junction, each magnetic tunnel junction being formed from a storage layer having a magnetization that can be switched from a first stable direction to a second stable direction, a sense layer having a variable magnetization direction, and an insulating layer between the storage layer and the sense layer; a first and second strap, respectively connected to the first and second magnetic tunnel junction and extending on each side of the first and second magnetic tunnel junction, respectively; a first and second selection transistor, respectively connected to one extremity of the first and second strap and allowing passing a heating current selectively through the first and second strap, respectively; a first and second current line for passing the heating current and/or a sense current; a first field line for passing at least a first write field current; and a conductive line electrically connecting in series the first and second magnetic tunnel junction at their ends opposed to the ones connecting the first and second straps, the first and second current line being respectively connected to the other extremity of the first and second strap, for passing the sense current through the first and second magnetic tunnel junctions when the two selection transistor are in a blocked mode; the method comprising:
during a write operation:
writing a first write data to the storage layer of the first magnetic tunnel junction, during a first write cycle of the write operation; and
writing a second write data to the storage layer of the second magnetic tunnel junction, during a second write cycle of the write operation; and
during a search operation:
aligning the magnetization of the sense layer of the first and second magnetic tunnel junctions in a first and second aligned directions, according to a search field current polarity passing in the first field line; and
comparing said first and second write data to the aligned magnetization of the sense layer of the two magnetic tunnel junctions by passing the sense current through the first and second magnetic tunnel junctions via the first and second straps when the first and second selection transistors are in a blocked mode.

13. The method according to claim 12, wherein
said writing a first write data comprises:
heating the first magnetic tunnel junction to a high temperature threshold;
switching the magnetization of the storage layer of the first magnetic tunnel junction in a first direction, and
cooling the first magnetic tunnel junction to a low temperature threshold at which the magnetization of the storage layer of the first magnetic tunnel junction is frozen in the written state; and wherein
said writing a second write data comprises:
heating the second magnetic tunnel junction to a high temperature threshold;
switching the magnetization of the storage layer of the second magnetic tunnel junction in a second direction, and
cooling the second magnetic tunnel junction to a low temperature threshold at which the magnetization of the storage layer of the second magnetic tunnel junction is frozen in the written state.

14. The method according to claim 12, wherein
said cell further comprises a second field line disposed substantially perpendicular to the first field line; and wherein
said switching the magnetization of the storage layer of the first magnetic tunnel junction includes passing a first write field current having a first polarity through the first field line or the second field line; and
said switching the magnetization of the storage layer of the second magnetic tunnel junction includes passing a second write field current having a second polarity through the first field line or the second field line.

15. The method according to any of the claims from 12 to 14, wherein
said heating the first magnetic tunnel junction includes passing the heating current through the first strap when the first selection transistor is in a passing mode;
and wherein said heating the second magnetic tunnel junction includes passing the heating current through the second strap when the second selection transistor is in the passing mode.

16. The method of claim 12, wherein
said search field current has a sequentially changing polarity.

17. The method of claim 12, wherein
the cell further comprises a sense transistor electrically connected to a pre-charged match line, the sense transistor being driven by a voltage on the conductive line, between the two magnetic tunnel junctions; and wherein
said passing a sense current generates a voltage on the conductive line, between the two magnetic tunnel junctions, the voltage driving the sense transistor to discharge or not the match line, depending on the first and second write data and the respective direction of the aligned sense layer magnetization in the two magnetic tunnel junctions.

* * * * *

UNITED STATES PATENT AND TRADEMARK OFFICE
CERTIFICATE OF CORRECTION

PATENT NO.        : 8,228,702 B2                                Page 1 of 1
APPLICATION NO.   : 12/821284
DATED             : July 24, 2012
INVENTOR(S)       : Javerliac et al.

It is certified that error appears in the above-identified patent and that said Letters Patent is hereby corrected as shown below:

Column 6, line 56 replace "two $R_s'/2$ resistances and two $R_s/2$ resistances, respectively." with --two $R_s/2$ resistances and two $R_s'/2$ resistances, respectively.--

Signed and Sealed this
Second Day of October, 2012

David J. Kappos
*Director of the United States Patent and Trademark Office*